(12) United States Patent
Mahdavifar et al.

(10) Patent No.: US 9,362,956 B2
(45) Date of Patent: Jun. 7, 2016

(54) METHOD AND SYSTEM FOR ENCODING AND DECODING DATA USING CONCATENATED POLAR CODES

(71) Applicant: Samsung Electronics Co., Ltd., Suwon-si, Gyeonggi-do (KR)

(72) Inventors: Hessam Mahdavifar, San Diego, CA (US); Mostafa El-Khamy, San Diego, CA (US); Jungwon Lee, San Diego, CA (US); Inyup Kang, San Diego, CA (US)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 97 days.

(21) Appl. No.: 14/158,571

(22) Filed: Jan. 17, 2014

(65) Prior Publication Data

US 2014/0208183 A1    Jul. 24, 2014

Related U.S. Application Data

(60) Provisional application No. 61/755,898, filed on Jan. 23, 2013.

(51) Int. Cl.
*H03M 13/00* (2006.01)
*H03M 13/29* (2006.01)
*H03M 13/27* (2006.01)
*H03M 13/13* (2006.01)
(Continued)

(52) U.S. Cl.
CPC ............ *H03M 13/296* (2013.01); *H03M 13/13* (2013.01); *H03M 13/27* (2013.01); *H03M 13/1102* (2013.01); *H03M 13/1515* (2013.01); *H03M 13/2707* (2013.01)

(58) Field of Classification Search
None
See application file for complete search history.

(56) References Cited

U.S. PATENT DOCUMENTS 5,056,105 A * 10/1991 Darmon ............ H03M 13/2785
                                                              341/81
5,778,139 A *  7/1998 Kim .............................. 386/200
(Continued)

FOREIGN PATENT DOCUMENTS

EP        1359672 A1    11/2003

OTHER PUBLICATIONS

A. Eslami et al., "A Practical Approach to Polar Codes", In: 2011 IEEE International Symposium on Information Theory Proceedings (ISIT), pp. 16-20, ISSN: 2157-8095, Jul. 31-Aug. 5, 2011 (http://ieeexplore.ieee.org/Xplore/home.jsp).
(Continued)

*Primary Examiner* — Daniel McMahon
(74) *Attorney, Agent, or Firm* — IP Investment Law Group

(57) ABSTRACT

A concatenated encoder is provided that includes an outer encoder, a symbol interleaver and a polar inner encoder. The outer encoder is configured to encode a data stream using an outer code to generate outer codewords. The symbol interleaver is configured to interleave symbols of the outer codewords and generate a binary stream. The polar inner encoder is configured to encode the binary stream using a polar inner code to generate an encoded stream. A concatenated decoder is provided that includes a polar inner decoder, a symbol de-interleaver and an outer decoder. The polar inner decoder is configured to decode an encoded stream using a polar inner code to generate a binary stream. The symbol de-interleaver is configured to de-interleave symbols in the binary stream to generate outer codewords. The outer decoder is configured to decode the outer codewords using an outer code to generate a decoded stream.

22 Claims, 5 Drawing Sheets

(51) Int. Cl.
*H03M 13/11* (2006.01)
*H03M 13/15* (2006.01)

(56) References Cited

U.S. PATENT DOCUMENTS

| | | | |
|---|---|---|---|
| 6,081,919 A | | 6/2000 | Fujiwara et al. |
| 8,189,627 B2* | | 5/2012 | Xia et al. ............... 370/535 |
| 8,537,919 B2 | | 9/2013 | Fonseka et al. |
| 2006/0015789 A1* | | 1/2006 | Shin et al. .............. 714/746 |
| 2009/0100309 A1* | | 4/2009 | Zheng ............. H04L 1/0041 714/748 |
| 2009/0125780 A1* | | 5/2009 | Taylor ............. H04L 13/1137 714/752 |
| 2010/0098180 A1* | | 4/2010 | Wennstrom ....... H04L 1/0071 375/260 |
| 2014/0331083 A1* | | 11/2014 | Aliev et al. .............. 714/6.23 |

OTHER PUBLICATIONS

Mayank Bakshi et al., Concatenated Polar Codes', In: 2010 IEEE International Symposium on Information Theory Proceedings (ISIT), pp. 918-922, Jun. 13-18, 2010 (http://ieeexplore.ieee.org/Xplore/home.jsp).

* cited by examiner

METHOD AND SYSTEM FOR ENCODING AND DECODING DATA USING CONCATENATED POLAR CODES

CROSS-REFERENCE TO RELATED APPLICATION(S) AND CLAIM OF PRIORITY

The present application is related to U.S. Provisional Patent Application No. 61/755,898, filed Jan. 23, 2013, titled "METHODS FOR CONSTRUCTING AND DECODING CONCATENATED POLAR CODES." Provisional Patent Application No. 61/755,898 is assigned to the assignee of the present application and is hereby incorporated by reference into the present application as if fully set forth herein. The present application hereby claims priority under 35 U.S.C. §119(e) to U.S. Provisional Patent Application No. 61/755,898.

TECHNICAL FIELD

The present application relates generally to data processing and, more specifically, to a method and system for encoding and decoding data using concatenated polar codes.

BACKGROUND

Polar codes are the most recent breakthrough in coding theory. Polar codes are the first and, currently, the only family of codes with explicit construction to achieve the capacity of a certain family of channels (i.e., binary input symmetric discrete memoryless channels) as the block length goes to infinity. They have encoding and decoding algorithms with very low complexity. However, at moderate block lengths, their performance does not compete with previously known codes, which prevents them from being implemented in practice.

SUMMARY

This disclosure provides a method and system for encoding and decoding data using concatenated polar codes.

In one embodiment, a concatenated encoder is provided. The concatenated encoder includes an outer encoder, a symbol interleaver and a polar inner encoder. The outer encoder is configured to encode a data stream using an outer code to generate a plurality of outer codewords. Each of the outer codewords includes a plurality of symbols. The symbol interleaver is configured to interleave the symbols of the outer codewords and to convert the interleaved symbols into a binary stream. The polar inner encoder is configured to encode the binary stream using a polar inner code to generate an encoded stream.

In another embodiment, a method of encoding is provided. The method includes encoding a data stream using at least one outer code to generate a plurality of outer codewords. Each of the outer codewords includes a plurality of symbols. The symbols of the outer codewords are interleaved. The interleaved symbols are converted into a binary stream. The binary stream is encoded using a polar inner code to generate an encoded stream.

In yet another embodiment, a concatenated decoder is provided. The concatenated decoder includes a polar inner decoder, a symbol de-interleaver and an outer decoder. The polar inner decoder is configured to decode an encoded stream using a polar inner code to generate a binary stream. The symbol de-interleaver is configured to convert the binary stream into a plurality of interleaved symbols and to de-interleave the interleaved symbols to generate a plurality of outer codewords. The outer decoder is configured to decode the outer codewords using an outer code to generate a decoded stream.

In still another embodiment, a method of decoding is provided. The method includes decoding an encoded stream using a polar inner code to generate a binary stream. The binary stream is converted into a plurality of interleaved symbols. The interleaved symbols are de-interleaved to generate a plurality of outer codewords. The outer codewords are decoded using an outer code to generate a decoded stream.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the term "each" means every one of at least a subset of the identified items; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 6, discussed below, and the various embodiments used to describe the principles of the present disclosure in this patent document are by way of illustration only and should not be construed in any way to limit the scope of this disclosure. Those skilled in the art will understand that the principles of the present disclosure may be implemented in any suitably arranged device or system.

Figure 1:
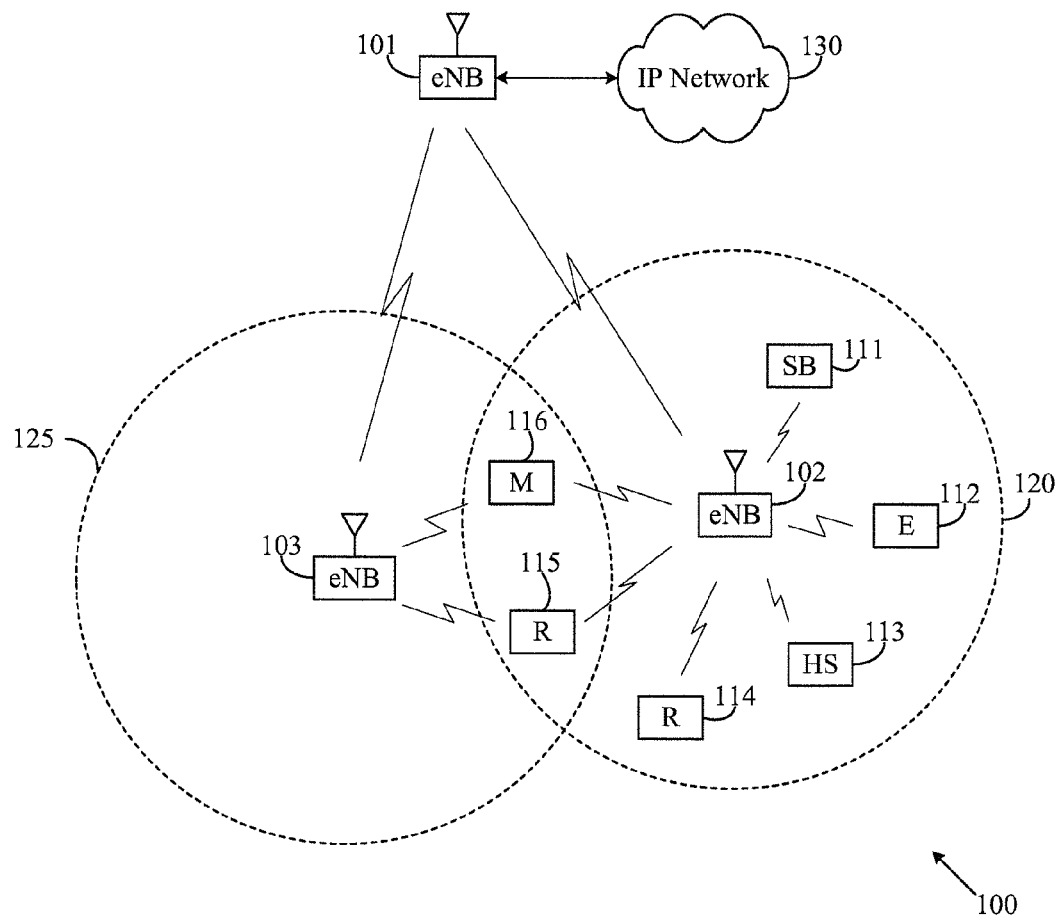
FIG. 1 illustrates a wireless network according to an embodiment of this disclosure.

FIG. 1 illustrates a wireless network 100 according to an embodiment of this disclosure. The embodiment of the wireless network 100 shown in FIG. 1 is for illustration only. Other embodiments of the wireless network 100 could be used without departing from the scope of this disclosure.

As shown in FIG. 1, the wireless network 100 includes an eNodeB (eNB) 101, an eNB 102, and an eNB 103. The eNB 101 communicates with the eNB 102 and the eNB 103. The eNB 101 also communicates with at least one Internet Protocol (IP) network 130, such as the Internet, a proprietary IP network, or other data network.

The eNB 102 provides wireless broadband access to the network 130 for a first plurality of user equipments (UEs) within a coverage area 120 of the eNB 102. The first plurality of UEs includes a UE 111, which may be located in a small business (SB); a UE 112, which may be located in an enterprise (E); a UE 113, which may be located in a WiFi hotspot (HS); a UE 114, which may be located in a first residence (R); a UE 115, which may be located in a second residence (R); and a UE 116, which may be a mobile device (M) like a cell phone, a wireless laptop, a wireless PDA, or the like. The eNB 103 provides wireless broadband access to the network 130 for a second plurality of UEs within a coverage area 125 of the eNB 103. The second plurality of UEs includes the UE 115 and the UE 116. In some embodiments, one or more of the eNBs 101-103 may communicate with each other and with the UEs 111-116 using 5G, LTE, E, LTE-A, WiMAX, or other advanced wireless communication techniques.

Depending on the network type, other well-known terms may be used instead of "eNodeB" or "eNB," such as "base station" or "access point." For the sake of convenience, the terms "eNodeB" and "eNB" are used in this patent document to refer to network infrastructure components that provide wireless access to remote terminals. Also, depending on the network type, other well-known terms may be used instead of "user equipment" or "UE," such as "mobile station," "subscriber station," "remote terminal," "wireless terminal," or "user device." For the sake of convenience, the terms "user equipment" and "UE" are used in this patent document to refer to remote wireless equipment that wirelessly accesses an eNB, whether the UE is a mobile device (such as a mobile telephone or smartphone) or is normally considered a stationary device (such as a desktop computer or vending machine).

Dotted lines show the approximate extents of the coverage areas 120 and 125, which are shown as approximately circular for the purposes of illustration and explanation only. It should be clearly understood that the coverage areas associated with eNBs, such as the coverage areas 120 and 125, may have other shapes, including irregular shapes, depending upon the configuration of the eNBs and variations in the radio environment associated with natural and man-made obstructions.

As described in more detail below, eNBs and/or UEs may encode data streams to be transmitted and decode received data streams using a concatenated polar coding technique. A concatenated polar encoding technique includes encoding data using an outer code to generate outer codewords, interleaving symbols of the outer codewords, and encoding the interleaved symbols using a polar inner code. Similarly, a concatenated polar decoding technique includes decoding encoded data using a polar inner code to generate interleaved outer codewords, de-interleaving symbols of the outer codewords, and decoding the de-interleaved symbols using an outer code.

Although FIG. 1 illustrates one example of a wireless network 100, various changes may be made to FIG. 1. For example, the wireless network 100 could include any number of eNBs and any number of UEs in any suitable arrangement. Also, the eNB 101 could communicate directly with any number of UEs and provide those UEs with wireless broadband access to the network 130. Similarly, each eNB 102-103 could communicate directly with the network 130 and provide UEs with direct wireless broadband access to the network 130. Further, the eNB 101, 102, and/or 103 could provide access to other or additional external networks, such as external telephone networks or other types of data networks.

Figure 2A:
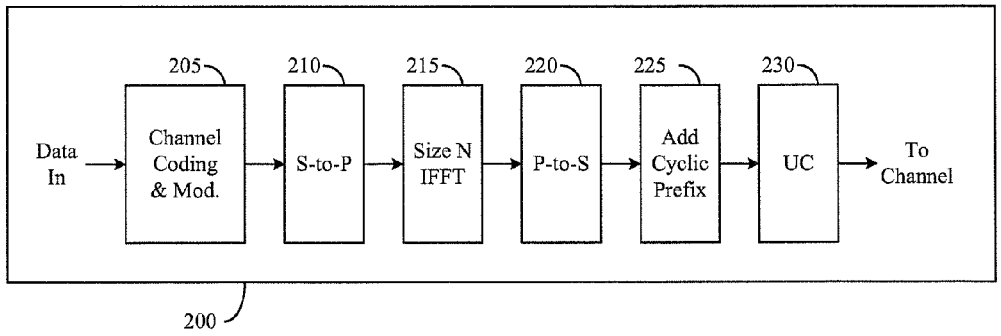
FIGS. 2A and 2B illustrate wireless transmit and receive paths according to an embodiment of this disclosure.
Figure 2B:
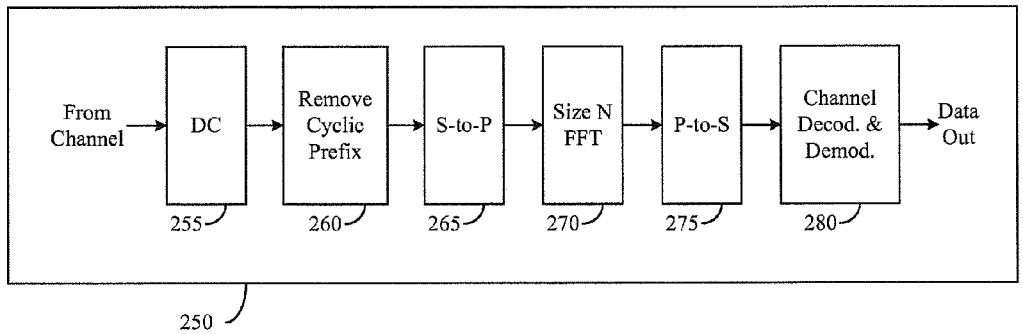

FIGS. 2A and 2B illustrate wireless transmit and receive paths according to an embodiment of this disclosure. In the following description, a transmit path 200 may be described as being implemented in an eNB (such as eNB 102), while a receive path 250 may be described as being implemented in a UE (such as UE 116). However, it will be understood that the receive path 250 could be implemented in an eNB and that the transmit path 200 could be implemented in a UE. In some embodiments, the transmit path 200 is configured to encode data streams for transmission using a concatenated polar encoding technique and the receive path 250 is configured to decode received data streams using a concatenated polar decoding technique.

The transmit path 200 includes a channel coding and modulation block 205, a serial-to-parallel (S-to-P) block 210, a size N Inverse Fast Fourier Transform (IFFT) block 215, a parallel-to-serial (P-to-S) block 220, an add cyclic prefix block 225, and an up-converter (UC) 230. The receive path 250 includes a down-converter (DC) 255, a remove cyclic prefix block 260, a serial-to-parallel (S-to-P) block 265, a size N Fast Fourier Transform (FFT) block 270, a parallel-to-serial (P-to-S) block 275, and a channel decoding and demodulation block 280.

In the transmit path 200, the channel coding and modulation block 205 receives a set of information bits, applies coding (such as the concatenated polar encoding technique described in more detail below), and modulates the input bits (such as with Quadrature Phase Shift Keying (QPSK) or Quadrature Amplitude Modulation (QAM)) to generate a sequence of frequency-domain modulation symbols. The serial-to-parallel block 210 converts (such as de-multiplexes) the serial modulated symbols to parallel data in order to generate N parallel symbol streams, where N is the IFFT/FFT size used in the eNB 102 and the UE 116. The size N IFFT block 215 performs an IFFT operation on the N parallel symbol streams to generate time-domain output signals. The parallel-to-serial block 220 converts (such as multiplexes) the parallel time-domain output symbols from the size N IFFT block 215 in order to generate a serial time-domain signal. The add cyclic prefix block 225 inserts a cyclic prefix to the time-domain signal. The up-converter 230 modulates (such as up-converts) the output of the add cyclic prefix block 225 to an RF frequency for transmission via a wireless channel. The signal may also be filtered at baseband before conversion to the RF frequency.

A transmitted RF signal from the eNB 102 arrives at the UE 116 after passing through the wireless channel, and reverse operations to those at the eNB 102 are performed at the UE 116. The down-converter 255 down-converts the received signal to a baseband frequency, and the remove cyclic prefix block 260 removes the cyclic prefix to generate a serial time-domain baseband signal. The serial-to-parallel block 265 converts the time-domain baseband signal to parallel time domain signals. The size N FFT block 270 performs an FFT algorithm to generate N parallel frequency-domain signals. The parallel-to-serial block 275 converts the parallel frequency-domain signals to a sequence of modulated data symbols. The channel decoding and demodulation block 280 demodulates and decodes the modulated symbols to recover the original input data stream. For example, the channel decoding and demodulation block 280 may decode the modulated symbols using the concatenated polar decoding technique described in more detail below.

Each of the eNBs 101-103 may implement a transmit path 200 that is analogous to transmitting in the downlink to UEs 111-116 and may implement a receive path 250 that is analogous to receiving in the uplink from UEs 111-116. Similarly, each of UEs 111-116 may implement a transmit path 200 for transmitting in the uplink to eNBs 101-103 and may implement a receive path 250 for receiving in the downlink from eNBs 101-103.

Each of the components in FIGS. 2A and 2B can be implemented using only hardware or using a combination of hardware and software/firmware. As a particular example, at least some of the components in FIGS. 2A and 2B may be implemented in software, while other components may be implemented by configurable hardware or a mixture of software and configurable hardware. For instance, the FFT block 270 and the IFFT block 215 may be implemented as configurable software algorithms, where the value of size N may be modified according to the implementation.

Furthermore, although described as using FFT and IFFT, this is by way of illustration only and should not be construed to limit the scope of this disclosure. Other types of transforms, such as Discrete Fourier Transform (DFT) and Inverse Discrete Fourier Transform (IDFT) functions, could be used. It will be appreciated that the value of the variable N may be any integer number (such as 1, 2, 3, 4, or the like) for DFT and IDFT functions, while the value of the variable N may be any integer number that is a power of two (such as 1, 2, 4, 8, 16, or the like) for FFT and IFFT functions.

Although FIGS. 2A and 2B illustrate examples of wireless transmit and receive paths, various changes may be made to FIGS. 2A and 2B. For example, various components in FIGS. 2A and 2B could be combined, further subdivided, or omitted and additional components could be added according to particular needs. Also, FIGS. 2A and 2B are meant to illustrate examples of the types of transmit and receive paths that could be used in a wireless network. Any other suitable architectures could be used to support wireless communications in a wireless network.

Figure 3:
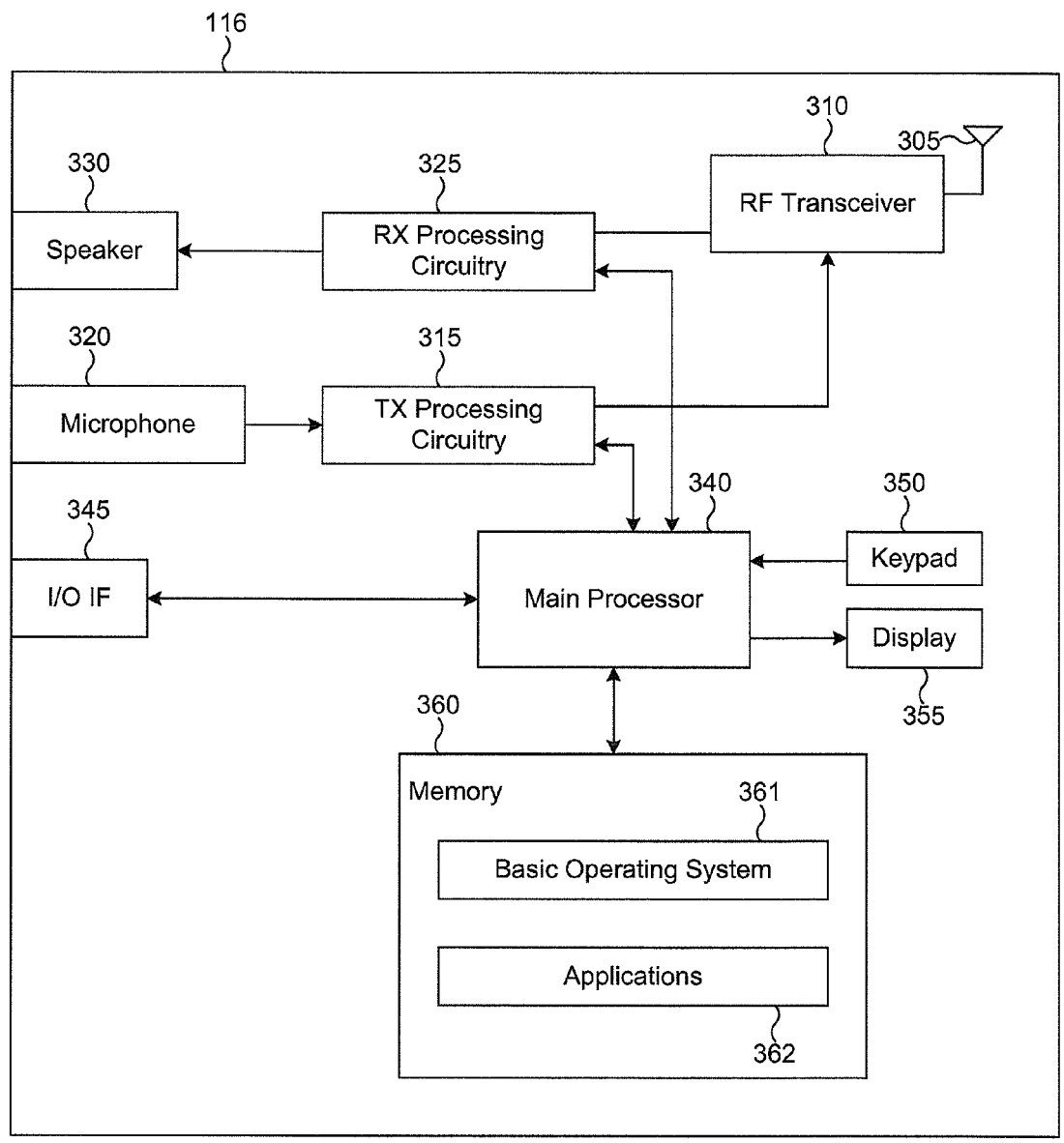
FIG. 3 illustrates user equipment according to an embodiment of this disclosure.

FIG. 3 illustrates a UE 116 according to an embodiment of this disclosure. The embodiment of the UE 116 illustrated in FIG. 3 is for illustration only, and the UEs 111-115 of FIG. 1 could have the same or similar configuration. However, UEs come in a wide variety of configurations, and FIG. 3 does not limit the scope of this disclosure to any particular implementation of a UE.

As shown in FIG. 3, the UE 116 includes an antenna 305, a radio frequency (RF) transceiver 310, transmit (TX) processing circuitry 315, a microphone 320, and receive (RX) processing circuitry 325. The UE 116 also includes a speaker 330, a main processor 340, an input/output (I/O) interface (IF) 345, a keypad 350, a display 355, and a memory 360. The memory 360 includes a basic operating system (OS) program 361 and one or more applications 362.

The RF transceiver 310 receives, from the antenna 305, an incoming RF signal transmitted by an eNB of the network 100. The RF transceiver 310 down-converts the incoming RF signal to generate an intermediate frequency (IF) or baseband signal. The IF or baseband signal is sent to the RX processing circuitry 325, which generates a processed baseband signal by filtering, decoding, and/or digitizing the baseband or IF signal. As described in more detail below, the RX processing circuitry 325 decodes the signal using a concatenated polar decoding technique. The RX processing circuitry 325 transmits the processed baseband signal to the speaker 330 (such as for voice data) or to the main processor 340 for further processing (such as for web browsing data).

The TX processing circuitry 315 receives analog or digital voice data from the microphone 320 or other outgoing baseband data (such as web data, e-mail, or interactive video game data) from the main processor 340. The TX processing circuitry 315 encodes, multiplexes, and/or digitizes the outgoing baseband data to generate a processed baseband or IF signal. As described in more detail below, the TX processing circuitry 315 encodes the data using a concatenated polar encoding technique. The RF transceiver 310 receives the outgoing processed baseband or IF signal from the TX processing circuitry 315 and up-converts the baseband or IF signal to an RF signal that is transmitted via the antenna 305.

The main processor 340 can include one or more processors or other processing devices and execute the basic OS program 361 stored in the memory 360 in order to control the overall operation of the UE 116. For example, the main processor 340 could control the reception of forward channel signals and the transmission of reverse channel signals by the RF transceiver 310, the RX processing circuitry 325, and the TX processing circuitry 315 in accordance with well-known principles. In some embodiments, the main processor 340 includes at least one microprocessor or microcontroller.

The main processor 340 can move data into or out of the memory 360 as required by an executing process. In some embodiments, the main processor 340 is configured to execute the applications 362 based on the OS program 361 or in response to signals received from eNBs or an operator. The main processor 340 is also coupled to the I/O interface 345, which provides the UE 116 with the ability to connect to other devices such as laptop computers and handheld computers. The I/O interface 345 is the communication path between these accessories and the main controller 340.

The main processor 340 is also coupled to the keypad 350 and the display unit 355. The operator of the UE 116 can use the keypad 350 to enter data into the UE 116. The display 355 may be a liquid crystal display or other display capable of rendering text and/or at least limited graphics, such as from web sites.

The memory 360 is coupled to the main processor 340. Part of the memory 360 could include a random access memory (RAM), and another part of the memory 360 could include a Flash memory or other read-only memory (ROM).

Although FIG. 3 illustrates one example of UE 116, various changes may be made to FIG. 3. For example, various components in FIG. 3 could be combined, further subdivided, or omitted and additional components could be added according to particular needs. As a particular example, the main processor 340 could be divided into multiple processors, such as one or more central processing units (CPUs) and one or more graphics processing units (GPUs). Also, while FIG. 3 illustrates the UE 116 configured as a mobile telephone or smartphone, UEs could be configured to operate as other types of mobile or stationary devices.

Figure 4:
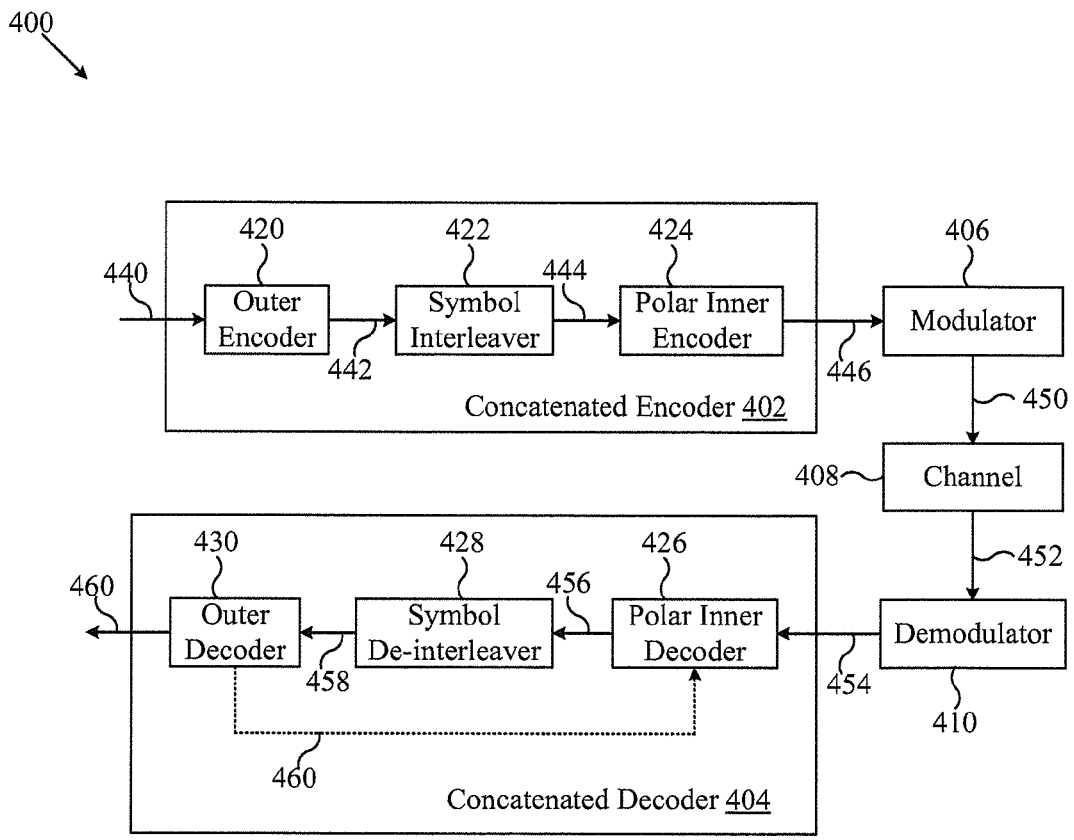
FIG. 4 illustrates a data processing system according to an embodiment of this disclosure.

FIG. 4 illustrates a data processing system 400 according to an embodiment of this disclosure. The data processing system 400 shown in FIG. 4 is for illustration only. A system for processing data using a concatenated polar technique may be configured in any other suitable manner without departing from the scope of this disclosure.

Polar codes are currently the only family of codes with explicit construction (no ensemble to pick from) to achieve the capacity of a certain family of channels (i.e., binary input symmetric discrete memoryless channels) as the block length goes to infinity. They have encoding and decoding algorithms with very low complexity. Their encoding complexity is n log n and their successive cancellation (SC) decoding complexity is O(n log n), where n is the length of the code. However, at moderate block lengths, their performance does not compete with conventional codes, which prevents them from being implemented in practice. Also, their error exponent decreases slowly as the block length increases, where the error-decay rate of polar codes under SC decoding is asymptotically $O(2^{-n^{0.5-\epsilon}})$.

Concatenating polar inner codes with outer linear codes (or other variations of concatenation-like parallel concatenation) may increase their practicality. The performance and decoding complexity of the concatenated code is dependent on the outer code used, the concatenation scheme and the decoding algorithms used for decoding the component codes. When constructed as described below, the concatenated construction can inherit the low encoding and decoding complexities of the polar inner code, while having significantly improved error-rate performance in comparison with the polar inner code.

Concatenating polar codes with outer codes improves the bound on the error-decay rate of the polar codes. However, conventional methods of concatenation result in the cardinality of the outer code alphabet being exponential in the block length of the polar inner code, making these methods infeasible for implementation in practical systems.

The error-decay rate of polar codes may be improved by concatenating them with interleaved block codes. With this technique, the alphabet cardinality of the outer code is no longer exponential and, in fact, is a design parameter which can be chosen arbitrarily. Furthermore, the code parameters can be set such that the total scheme still achieves the capacity while the error-decay rate is asymptotically $2^{-N^{1-\epsilon}}$ for any $\epsilon>0$, where N is the total block length of the concatenated scheme. This bound provides considerable improvements upon $2^{-n^{0.5-\epsilon}}$, the error-decay rate of conventional polar codes. In fact, the information theoretic lower bound on the probability of error of any capacity achieving code is $2^{-N}$.

Therefore, this type of concatenated polar code provides the ultimate bound on the error decay rate of any capacity achieving code. Considering transmission over channels with erasure bursts, this type of code performs well and greatly improves upon the performance of conventional polar code techniques. For example, for transmission over an arbitrary binary symmetric channel where the received symbols encounter a single erasure burst, if the length of erasure burst is at least $2\sqrt{n}-1$ (where n is the length of polar code), then a conventional SC decoder fails to recover the transmitted message. On the other hand, the parameters of the concatenated polar code implemented by the data processing system 400 can be set in such a way that the concatenated polar code approaches the capacity of the channel with the same error-decay rate as in non-concatenated polar codes.

For some embodiments, as described in more detail below, a rate-adaptive method may be used to construct the concatenated polar code at finite block length in order to minimize the rate loss resulting from the outer block code. Not all of the selected good bit-channels have the same performance. Some of the information bits observe very strong and almost noiseless channels, while some other information bits observe weaker channels. Thus, the outer code may provide unequal protection for the selected bit-channels, i.e., the strongest information bit-channels may not need another level of protection by the outer code, while the rest are protected by certain outer codes whose rates are determined based on the error probability of the corresponding bit-channels. Therefore, a criterion may be established for determining the rates of the outer codes.

For some embodiments, as described below in connection with FIG. 5, the symbols of a same outer code see the same set of bit-channels, which are different from one outer code to another. In other words, each outer codeword is re-encoded by the same bit-channel index across the different polar codewords. Therefore, the rate of each outer code can be properly assigned to protect the polarized bit-channels in such a way that all the information bits are almost equally protected.

For the embodiment illustrated in FIG. 4, the data processing system 400 is configured to encode and decode information using a concatenated polar code as described above. The data processing system 400 may be configured to encode information at a source, transmit the encoded information to a destination, and decode the encoded information at the destination. Alternatively, the data processing system 400 may be configured to encode information and store the encoded information in a data store and, subsequently, to retrieve the encoded information from the data store and decode the encoded information.

For the illustrated embodiment, the data processing system 400 comprises a concatenated encoder 402, a concatenated decoder 404, a modulator 406, a channel 408 and a demodulator 410. The concatenated encoder 402 comprises an outer encoder 420, a symbol interleaver 422 and a polar inner encoder 424. Similarly, the concatenated decoder 404 comprises a polar inner decoder 426, a symbol de-interleaver 428 and an outer decoder 430.

The outer encoder 420 is configured to encode a data stream 440 using a specified outer code in order to generate a plurality of outer codewords 442, each of which comprises a plurality of symbols. The outer encoder 420 may be configured to encode the data stream 440 using any suitable coding technique. For some embodiments, a Reed-Solomon (RS) code may be used as the outer code because RS codes are maximal distance separable (MDS) codes and, thus, have the largest bounded-distance error-correction capability at a specified code rate. RS codes also have excellent burst error-correction capability. However, it will be understood that the outer encoder 420 may be configured to encode the data stream 440 using any suitable block code, such as a low-density parity check (LDPC) code or the like.

The symbol interleaver 422 may comprise a structured block interleaver or any other suitable type of interleaver, such as a polynomial interleaver. The symbol interleaver 422 is configured to interleave the symbols of the outer codewords 442 and to convert the interleaved symbols into a binary stream 444 using a fixed basis.

The polar inner encoder 424 is configured to encode the binary stream 444 using a polar inner code to generate an original encoded data stream 446. By interleaving the symbols and converting them into a binary stream 444, the symbol interleaver 422 allows the alphabet size of the outer code to be independent of the alphabet size of the polar inner code. Thus, the symbol interleaver 422 eliminates any need for a large field size for the outer code.

The modulator 406 is configured to convert the original encoded data stream 446 into a first signal 450 for transmission through, or storage in, the channel 408. The modulator 406 may be configured to implement any suitable modulation scheme, such as QAM, QPSK, or the like. The channel 408 is configured to provide a second signal 452 to the demodulator 410 based on the first signal 450. The channel 408 may represent any suitable transmission or storage medium, such as a wired or wireless medium for signal transmission, an optical storage medium, an electrical storage medium, or the like. The second signal 452 comprises substantially the same information included in the first signal 450; however, the second signal 452 may be altered or corrupted during transmission through, or storage in, the channel 408 due to random noise and/or limitations in the transmission or storage capabilities of the channel 408. The demodulator 410 is configured to convert the second signal 452 into a received encoded data stream 454. When converting the second signal 452 into the received encoded data stream 454, the demodulator 410 is configured to implement the same modulation scheme implemented by the modulator 406.

The polar inner decoder 426 is configured to decode the received encoded data stream 454 using the same polar inner code as the polar inner encoder 424 to generate a partially decoded data stream 456. The symbol de-interleaver 428 comprises the same type of interleaver as the symbol interleaver 422. For example, if the symbol interleaver 422 comprises a structured block interleaver, the symbol de-interleaver 428 comprises a structured block de-interleaver. The symbol de-interleaver 428 is configured to convert the partially decoded data stream 456 into a plurality of interleaved symbols using a fixed basis. The symbol de-interleaver 428 is also configured to de-interleave the interleaved symbols to generate a plurality outer codewords 458.

The outer decoder 430 is configured to decode the outer codewords 458 using the same type of outer code as the outer encoder 420. For example, if the outer encoder 420 is configured to encode the data stream 440 using an RS code, the outer decoder 430 is configured to decode the outer codewords 458 using an RS code. After decoding the outer codewords 458 using the outer code, the outer decoder 430 is configured to generate a decoded data stream 460 corresponding to the data stream 440.

As described in more detail below, for some embodiments, the outer decoder 430 may be configured to provide the decoded data stream 460 to the polar inner decoder 426 for use in decoding the received encoded data stream 454 in an SC decoding technique. In addition, for some embodiments, the polar inner decoder 426 may be configured to generate soft outputs for the partially decoded data stream 456. For these embodiments, the outer decoder 430 may use the probabilities associated with the soft outputs to improve the performance of the decoding process for the outer codewords 458.

Figure 5:
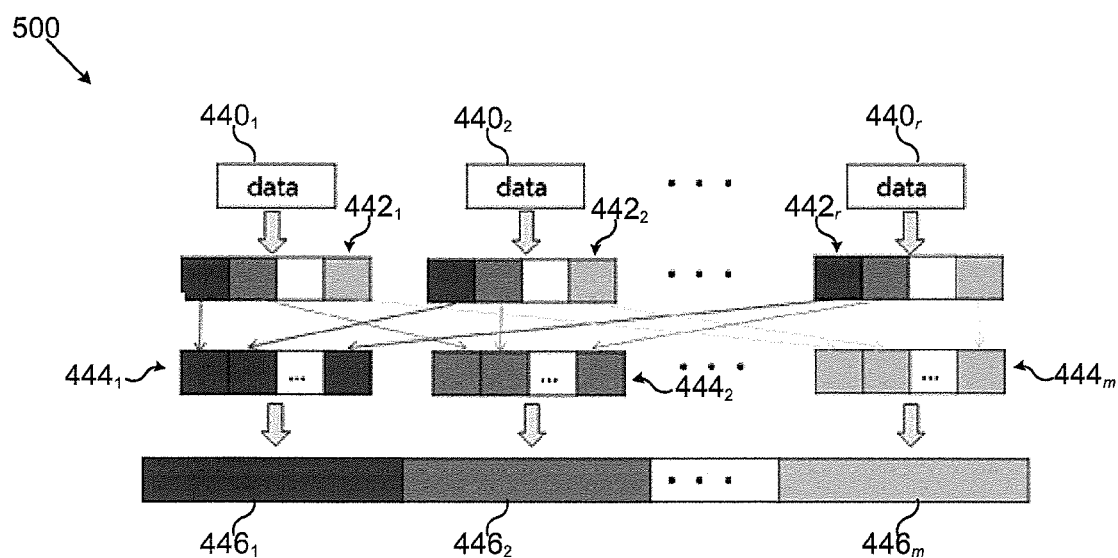
FIG. 5 illustrates a process of encoding a data stream using a concatenated polar encoding technique according to an embodiment of this disclosure.

FIG. 5 illustrates a process 500 of encoding the data stream 440 using the concatenated polar encoder 402 of FIG. 4 according to an embodiment of this disclosure. The process 500 shown in FIG. 5 is for illustration only. A process for encoding data using a concatenated polar encoding technique may be configured in any other suitable manner without departing from the scope of this disclosure.

The following description of the process 500 corresponds to the data processing system 400 of FIG. 4. However, for this description, the outer encoder 420 (not shown in FIG. 5) may comprise, or function as, a plurality of outer sub-encoders, and the polar inner encoder 424 (also not shown in FIG. 5) may comprise, or function as, a plurality of polar inner sub-encoders.

Initially, a data stream 440 is provided to the outer encoder 420. For the illustrated embodiment, the outer encoder 420 comprises r outer sub-encoders and, thus, the data stream 440 comprises r portions $440_{1-r}$, each of which is provided to a corresponding one of the r outer sub-encoders. Each outer sub-encoder encodes the corresponding portion of the data stream 440 to generate an outer codeword 442. As there are r outer sub-encoders, the portions $440_{1-r}$ are encoded to generate r outer codewords $442_{1-r}$. For example, a second outer sub-encoder encodes a second portion $440_2$ of the data stream 440 to generate a second outer codeword $442_2$.

The symbol interleaver 422 (not shown in FIG. 5) then interleaves the r outer codewords $442_{1-r}$ and converts the interleaved outer codewords into a binary stream 444 using a fixed basis. Each of the outer codewords $442_{1-r}$ has a length of m symbols. Thus, after processing by the symbol interleaver 422, the outer codewords $442_{1-r}$ are converted into a binary stream 444 comprising m portions $444_{1-m}$. The binary stream 444 is then provided as an input to the polar inner encoder 424.

For the illustrated embodiment, a first polar inner sub-encoder encodes the bits corresponding to the first symbols of each of the outer codewords $442_{1-r}$ into a first polar codeword $446_1$. Similarly, a second polar inner sub-encoder encodes the bits corresponding to the second symbols of each of the outer codewords $442_{1-r}$ into a second polar codeword $446_2$. Thus, the polar inner encoder 424 encodes the binary stream 444 into m polar codewords $446_{1-m}$. This polar encoding can be done in parallel, which reduces the encoding latency. In this way, the implementation of a concatenated polar coding scheme is provided with improved finite length performance as compared to conventional polar coding techniques, while preserving the low decoding complexity of those techniques.

The construction of polar codes is based on a phenomenon called channel polarization. Let $$G = \begin{bmatrix} 1 & 0 \\ 1 & 1 \end{bmatrix}.$$

The $n^{th}$ Kronecker power is determined by applying the Kronecker power to G to get $G^{\otimes n}$. As a result:

$$G^{\otimes (n+1)} = \begin{bmatrix} G^{\otimes n} & 0 \\ G^{\otimes n} & G^{\otimes n} \end{bmatrix}.$$

Then a block of $N=2^n$ uniform independent and identically distributed (i.i.d.) information bits $V_1^N=(V_1, V_2, \ldots, V_N)$ may be multiplied by $G^{\otimes n}$ to get the vector $X_1^N$. The result may be transmitted through N independent copies of a binary input discrete memoryless channel (B-DMC) W. This is called polar transformation. Applying the chain rule to the mutual information between the input $V_1^N$ and the output $Y_1^N$ yields:

$$I(V_1^N;Y_1^N)=\Sigma_{i=1}^N I(V_i;Y_1^N|V_1^{i-1})=\Sigma_{i=1}^N I(V_i;Y_1^N,V_1^{i-1}).$$

Since the bits $V_i$ are independent, the last equality follows. Due to the channel polarization phenomenon, as N goes to infinity, the terms in this summation approach either 0 or 1. Furthermore, the fraction of them that tend to 1 approaches the symmetric mutual information I(W). If the channel W is symmetric, I(W) is equal to the capacity of W.

The term $I(V_i; Y_1^N, V_1^N)$ can be also interpreted as the channel that is seen by the bit $V_i$ when an SC decoder is used at the output. Under an SC method, the bits $V_1^{i-1}$ are already decoded and available when $V_i$ is decoded. This channel is called the $i^{th}$ bit-channel and is denoted by $W_N^{(i)}$. Due to the channel polarization, as N grows large, the corresponding bit-channels polarize, i.e., they either approach a noiseless channel (good channel) or a pure-noise channel (bad channel). Moreover, if the channel W is symmetric, then the fraction of bit-channels that become noiseless approaches the capacity of W.

Therefore, constructing polar codes based on channel polarization may include transmitting information bits over good bit-channels while fixing the input to bad channels to zeroes, which corresponds to a linear code. The generator matrix of this code for length $N=2^n$ is a sub-matrix of $G^{\otimes n}$, which comprises those rows of $G^{\otimes n}$ that correspond to the good bit-channels. The complexity of the encoder is N log N thanks to the recursive structure of the matrix G⊗n. An SC decoder for polar codes can be implemented with O(N log N) complexity. In addition, for any $\beta<0.5$, a polar code of length N associated with a certain set of good bit-channels approaches the capacity of W while the probability of frame error under SC decoding is less than $2^{-N^\beta}$.

Therefore, for some embodiments, the concatenated decoder 404 may be configured to implement an SC method for decoding the polar concatenated scheme, which includes the interleaved concatenation scheme described above, where the symbols of each outer codeword are distributed over the same coordinates of multiple polar codewords. Conventional SC decoding algorithms for polar codes may propagate an error through a whole polar codeword once the error occurs. Since in concatenated schemes the information block of the polar code is protected using an outer code, the estimated decoded bits can be corrected using the outer code while the SC polar inner decoder 426 evolves. This technique mitigates the error propagation problem and, consequently, results in an improvement in the performance of the concatenated decoder 404.

Using an outer code that comprises a block code with an alphabet size of $2^r$, the concatenated decoder 404 may be configured to perform SC decoding as follows. The polar inner decoder 426 decodes the first r bits of each polar codeword to find estimations for the symbols of the first outer codeword. This operation can be done in parallel for the polar codewords. The polar inner decoder 426 passes these symbols to the outer decoder 430, which may correct possible errors. The polar inner decoder 430 then updates the first r decoded bits of the polar codewords using the output of the outer decoder 430 and uses them to continue the SC decoding. The same process is performed for the second symbol, the third symbol, etc.

For some embodiments, depending on the chosen outer code and its chosen decoding algorithm, the information exchanged between the SC polar inner decoder 426 and the outer decoder 430 can be soft information, such as log-likelihood ratios (LLRs), or hard-decision bits. Thus, the outer decoder 430 may be configured to perform generalized minimum distance (GMD) list decoding for the outer code.

GMD decoding introduces a new distance measure that allows the soft information to be used in algebraic minimum distance decoding. Thus, for some embodiments, the outer decoder 430 may use this technique to take advantage of soft information generated by the polar inner decoder 426. In a particular embodiment in which RS codes are used as the outer codes, the likelihood of each symbol can be computed given the LLRs of the corresponding bits generated by the SC polar inner decoder 426 of the polar inner code. Then, the m symbols of the RS outer code may be sorted with respect to their likelihoods.

If the minimum distance of the RS outer code is d, the least likely symbols may be declared as erasure. The first case is the case of no erasure whose output is the same as a conventional RS decoder. The next case is that the two least likely symbols are declared as erasures and the decoding algorithm is performed on the RS outer code. Then, four erasures may be declared, and so on. When d−1 erasures are declared, a list is generated with a size of at most (d+1)/2 codewords as the possible candidates for the output of the outer decoder 430. The outer decoder 430 selects the closest one to the received word and provides the selected candidate as the output. Some implementations of GMD decoding increase the complexity by a factor of (d+1)/2. However, an efficient general GMD decoding scheme that removes this factor may be implemented instead. In the case that the outer codes are RS codes, other suitable soft decoding algorithms may be implemented. However, GMD may be implemented to preserve the bound on the decoding complexity of the polar codes.

As described above, for some embodiments, the outer decoder 430 may be configured to select the most likely candidate based on soft information from the polar inner decoder 426. One approach to this is to approximate the symbol probabilities using the bit LLRs generated by the polar inner decoder 426. The bit LLRs in each symbol are not independent; however, using this approach provides some gain with no cost in complexity. For this embodiment, a codeword is selected from the list generated by the GMD outer decoder 430 based on its estimated probability given by the product of estimated symbol probabilities. This approach may be referred to as GMD with approximate maximum likelihood (ML) decoding.

In a second approach, the SC polar inner decoder 426 may be modified to output soft information for each of the possible symbols. In a symbol comprising r bits, the LLR of each bit depends on the previous bits in the symbol. Therefore, for this approach, the polar inner decoder 426 is configured to compute the probabilities of the $2^r$ symbols by going along each possible path. This increases the complexity of the polar inner decoder 426 by a constant factor of $2^r/r$, which is acceptable for small designs of r, which enables the implementation of GMD with exact ML decoding as the decoding method. Also, the LLRs computed along each path may be saved. When the correct symbol is selected by the outer decoder 430, the LLRs computed along the corresponding path may be taken into account by the SC polar inner decoder 426.

The decoding complexity of the concatenated decoder 404 is dependent on the decoding complexity of both the inner polar code and the outer code. The decoding complexity of inner polar codes using SC decoding is given by O(n log n). Since there are m inner polar codes in the proposed concatenated scheme, the total complexity resulting from decoding the inner polar codes is O(nm log m), which is bounded by O(N log N). For RS outer codes, a new syndrome-less algorithm for decoding RS codes can be applied that uses fast Fourier transform and computes the message symbols directly without computing error locations or error magnitudes. For RS outer codes over arbitrary fields, the asymptotic complexity of syndrome-less decoding based on multiplicative FFT techniques is $O(m \log^2 m \log \log m)$. Thus, for the concatenated decoder 404, the total decoding complexity resulting from RS outer codes is at most $O(nm \log^2 m \log \log m)$, which is bounded by $O(N \log^2 N \log \log N)$. This is for the asymptotic analysis of the decoding complexity, which illustrates that the concatenated decoder 404 has a similar decoding complexity as compared to non-concatenated polar codes. For embodiments using an RS outer code with a length that is too short, the standard Berlekamp-Massey algorithm may be implemented.

For a particular embodiment described below, the outer code is an RS code, bounds are established on the error correction performance, and rate-adaptive construction is implemented. For this embodiment, the outer decoder 430 is configured to enable correction of failures in the polar inner decoder 426 as long as the total number of failures falls within the error-correction capability of the RS outer code. The cost is the rate reduction in the rate of the whole scheme compared to the rate of the inner polar code. If the length and rate of the inner polar code are n and $R_1$, respectively, and the length and rate of the outer code are m and $R_O$, respectively, the probability of block error of the inner polar code under SC decoding is bounded by $2^{-n^{0.5-\epsilon}}$, when the block length n is large enough. The probability of the failure in the whole system is bounded by $$2^{-\left(\frac{n^{0.5-\epsilon}(1-R_O)}{2}-1\right)m}.$$

The length of the codeword for the whole system is N=nm. The values of m, n and $R_O$ can be set in such a way that the error probability of the scheme scales as $2^{-N^{1-\epsilon}}$, for any $\epsilon>0$, asymptotically, while the scheme is still capacity achieving. This significantly improves the error decay rate compared to a polar code with the same length N. In addition, the size of the alphabet for the RS outer code scales as m, whereas it is exponential in terms of n in conventional concatenated polar code schemes.

The number of input bits to each polar inner sub-encoder is denoted by k (e.g., the first portion of the binary stream 444$_1$ provided to the first polar inner sub-encoder comprises k bits). Thus, the rate of each polar inner code is $R_1$=k/n. The symbols of the RS outer codes are drawn from the finite field $\mathbb{F}_{2^t}$, with cardinality $2^t$ (k is divisible by t). Thus, for this embodiment, the number of RS outer codes is r=k/t, the number of polar inner codes is m, and r RS outer codewords of length m over $\mathbb{F}_{2^t}$ are given. Then, for i=1, 2, . . . , r, the $i^{th}$ outer codeword is denoted by $(c_{i,1}, c_{i,2}, \ldots, C_{i,m})$. Then, the $j^{th}$ polar codeword is the output of the polar inner encoder 424 having a rate k/n with the input $I(c_{1,j}), I(c_{2,j}), \ldots, I(c_{r,j})$, where I(c) maps a symbol $c \in \mathbb{F}_{2^t}$ to its binary image with t bits and I(c) corresponds to the binary stream 444 output by the symbol interleaver 422. Thus, as described above, the total length of the concatenated codeword is N=nm. Also, since t=k/r, t can be fixed as k grows by increasing the number of RS outer codewords.

For a rate-adaptive method according to some embodiments, the probability of error of each of the bit-channels can be estimated as follows. SC decoding may be performed for a polar transformation with input $u_1^n$ and output $y_1^n$. For i=1, 2, . . . , N, the previous input bits indexed by 1, 2, . . . , i−1 may be provided to the polar inner decoder 426 by a genie at the time that the $i^{th}$ bit is decoded. The polar inner decoder 426 is run for a sufficiently large number of uniformly distributed independent inputs to get an estimate of the probability of the event that the $i^{th}$ bit is not decoded successfully given that the bits indexed by 1, 2, . . . , i−1 are successfully decoded. If k is the information block length of the polar inner code, for i=1, 2, . . . , k, $P_i$ denotes the estimated probability that an error occurs in decoding of the $i^{th}$ information bit in the polar inner decoder 426 assuming that all the first i−1 information bits are successfully recovered.

If the RS outer code is over $\mathbb{F}_{2^r}$, then the total number of RS codes is k/r. The first k/r information bits of each polar codeword 446 form one symbol for the first RS code, the next k/r information bits form one symbol for the second RS code, etc. If we look at one of the polar inner codes, the probability that the first symbol is not successfully decoded by the polar inner decoder 426 is given by $1-(1-P_1)(1-P_2) \ldots (1-P_r)$. In general, for i=1, 2, . . . , k/r, the probability that the $i^{th}$ symbol is in error assuming that all the previous symbols are decoded successfully is given by $Q_i=1-(1-P_{ir-r+1}) \ldots (1-P_{ir})$.

The design criterion is as follows. If $P_{ef}$ is the target probability of frame error, then for i=1, 2, . . . , k/r, $t_i$ is the smallest positive integer such that:

$$\binom{m}{t_i+1} Q_i^{t_i+1} < P_{ef}/k.$$

Using this criterion, $t_i$-error correcting RS outer code may be selected for the $i^{th}$ RS outer code. This provides a frame error probability of $P_{ef}$. Thus, for this embodiment, each outer sub-encoder is configured to operate at a specified rate that is determined based on this frame error probability.

For a specific, numerical example of rate-adaptive construction, a polar inner code of length 512 and RS outer code of length 15 may be used for transmission over an additive white Gaussian noise (AWGN) channel. The corresponding probability of error of the polar bit-channels under SC decoding may be estimated when used over an AWGN channel at a certain SNR (2 dB). The sample space size for this example is $10^5$.

The design criterion for the RS outer code is as follows. The parameter k as the input length of the polar inner code is fixed. A determination may be made as to which k corresponds to the best performance of the data processing system 400, using values of k varying between 170 (inner rate ⅓) and 256 (inner rate ½). For this example, k is a multiple of 4. Then the best k bit-channels that have a smaller probability of errors may be picked and sorted with respect to their indices. So for $(i_1, i_2, \ldots, i_k)$ with corresponding bit-channel probabilities of errors $(p_1, p_2, \ldots, P_k)$, a target probability of error $P_e$ is fixed (with $10^{-2}$ as the initial value) for each of the small sub-blocks of length 4. (The size of the alphabet for the RS outer code in this example is $2^4$=16.)

For j=1, 2, . . . , k/4, the union bound of the probability of error of the j-th sub-block of length 4 is $Q_j=P_{4j-3}+P_{4j-2}+P_{4j-1}+P_{4j}$. Then the smallest integer $t_j$ is picked such that:

$$\sum_{l=t_j+1}^{m} \binom{m}{l} Q_j^l (1-Q_j)^{m-l} < P_e.$$

The left hand side of the above equation is the probability that the $j^{th}$ RS outer code fails if a $t_j$-error correction RS outer code is used on the $j^{th}$ sub-block, and m is the length of the RS outer code. The total rate of the scheme is computed to see if it is above or below ⅓, with the target rate being ⅓. Then the target probability of error $P_e$ is modified accordingly and the steps are repeated.

For this particular example, the selected length for the polar inner code is 204 and the number of RS outer codes is 204/4=51. There are 18 RS outer codes with no redundancy (rate 1), 12 RS outer codes (15,13), 12 RS outer codes (15,11), 8 RS outer codes (15,9) and 1 RS outer code (15,7). The rate of the total scheme for the example is 0.33, which is the desired rate, and the frame probability of error is 0.02.

In the above example, the outer code was an RS code. However, as previously described, for other embodiments, any block code over an alphabet whose size is a power of 2 can be used. For example, for a block code over an alphabet of size $2^r$, each of the symbols can be mapped into a binary string of length r. Therefore, the proposed encoding process 500 illustrated in FIG. 5 can be applied to this concatenated scheme as well. Given the error-correction capability of the outer block code, the criterion for designing the rate-adaptive construction can be adjusted accordingly.

Assuming that the total length of the concatenated code is fixed, a trade-off exists between the lengths of inner and outer codes. The longer the polar inner code, the further polarization happens, which results in better performance in the inner code. On the other hand, a longer RS outer code provides better error correction capability and also a wider range of rates to be chosen by the rate-adaptive scheme, thereby making the concatenated code more efficient.

Using the disclosed process, a significant improvement in the error-decay rate compared to non-concatenated polar codes is possible that ultimately fills the gap with the information theoretic bound. The parameters of the process can be set to inherit the capacity-achieving property of polar codes while working in the same regime of low complexity. The disclosed concatenated polar code performs well over channels with erasure bursts, while the original polar codes are relatively weak in this regard. The encoding and decoding techniques described above in connection with FIGS. 4 and 5 improve the performance at finite block lengths, makes the use of polar codes more practical. In addition, the encoding and decoding methods may be used when the outer code is a binary code by grouping each t bits, where t is a complexity parameter to be optimized. If the outer code has a low complexity soft decoding algorithm, then the decoding techniques based on GMD decoding of RS codes can be extended to this case as well.

Although FIG. 4 illustrates one example of a data processing system 400 for processing data using a concatenated polar technique, various changes may be made to FIG. 4. For example, the makeup and arrangement of the data processing system 400 are for illustration only. Components could be added, omitted, combined, subdivided, or placed in any other suitable configuration according to particular needs.

Figure 6:
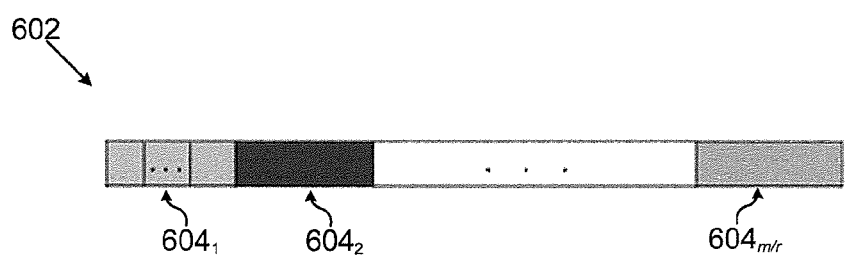
FIG. 6 illustrates a process of splitting a binary codeword into sub-blocks according to an embodiment of this disclosure.

FIG. 6 illustrates a process of splitting a binary codeword 602 into sub-blocks 604 according to an embodiment of this disclosure. In some of the examples described above in connection with FIGS. 4 and 5, the outer code was a Reed-Solomon code. However, for other embodiments, a non-binary block code over an alphabet whose size is a power of 2 can be implemented.

For a block code over an alphabet of size $2^r$, each of the symbols can be mapped into a binary string of length r. The SC decoding algorithm described above also can be used for this general embodiment. For any decoding algorithm for the outer code that uses soft channel information, the LLRs computed by the inner polar decoder 426 can be used as a soft input to the outer decoder 430. This is analogous to the GMD decoding technique used for the RS-polar concatenated scheme previously discussed.

For another embodiment, similar to the encoding process 500 of FIG. 5, the polar inner decoder 426 (not shown in FIG. 6) may comprise, or function as, a plurality of polar inner sub-decoders. For this embodiment, a binary block code may be used as the outer code. When r is an integer dividing the block length m of the outer code, each outer codeword 602 may be divided into m/r sub-blocks 604 of length r each, as shown in FIG. 6. Then the first sub-block 604$_1$ forms the input to the first polar inner sub-decoder, the second sub-block 604$_2$ forms the input to the second polar inner sub-decoder, etc. As a result, in addition to SC decoding, the disclosed GMD-ML decoding technique can be also applied to this embodiment.

Modifications, additions, or omissions may be made to the systems, apparatuses, and methods described herein without departing from the scope of this disclosure. For example, the components of the systems and apparatuses may be integrated or separated. Moreover, the operations of the systems and apparatuses may be performed by more, fewer, or other components. The methods may include more, fewer, or other steps. Additionally, steps may be combined and/or performed in any suitable order.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A concatenated encoder, comprising:
an outer encoder configured to encode a data stream using at least one outer code to generate a plurality of outer codewords, each of the outer codewords including a plurality of symbols ordered in a sequence with a first-occurring symbol and a second-occurring symbol immediately adjacent thereto;
a symbol interleaver configured to:
interleave the symbols of the outer codewords according to the sequence grouping together instances of the first-occurring symbol from the outer codewords and grouping together instances of the second-occurring symbol from the outer codewords,
convert a result of interleaving the symbols into a binary stream; and
a polar inner encoder configured to encode the binary stream using a polar inner code to generate an encoded stream.

2. The concatenated encoder of claim 1, wherein parameters of the at least one outer code are independent of parameters of the polar inner code.

3. The concatenated encoder of claim 1, wherein the outer encoder comprises a plurality of outer sub-encoders and the at least one outer code comprises a plurality of outer codes associated with a specified type of coding technique, and wherein each of the plurality of outer sub-encoders is configured to encode a corresponding portion of the data stream using a corresponding one of the plurality of outer codes to generate one of the outer codewords.

4. The concatenated encoder of claim 3, wherein each of the plurality of outer sub-encoders is configured to operate at a specified rate determined based on a frame error probability.

5. The concatenated encoder of claim 1, wherein the symbol interleaver comprises a structured block interleaver configured to convert the result of interleaving the symbols into the binary stream using a fixed basis.

6. A method of encoding, comprising:
encoding a data stream using at least one outer code to generate a plurality of outer codewords, each of the outer codewords comprising a plurality of symbols ordered in a sequence with a first-occurring symbol and a second-occurring symbol immediately adjacent thereto;
interleaving the symbols of the outer codewords according to the sequence grouping together instances of the first-occurring symbol of the outer codewords and grouping together instances of the second-occurring symbol of the outer codewords;
converting a result of interleaving the symbols into a binary stream; and
encoding the binary stream using a polar inner code to generate an encoded stream.

7. The method of claim 6, wherein parameters of the at least one outer code are independent of parameters of the polar inner code.

8. The method of claim 6, wherein the at least one outer code comprises a plurality of outer codes associated to a specified type of coding technique, and wherein encoding the data stream comprises encoding each of a plurality of portions of the data stream using a corresponding one of the outer codes.

9. The method of claim 8, further comprising, for each of the plurality of outer codes:
  determining a rate based on a frame error probability and on mapping of the symbols of the outer codewords to the polar inner code; and
  encoding the corresponding portion of the data stream at the rate.

10. The method of claim 6, wherein converting the interleaved symbols comprises converting the result of interleaving the symbols into the binary stream using a fixed basis.

11. A concatenated decoder, comprising:
  a polar inner decoder configured to decode an encoded stream using a polar inner code to generate a binary stream including a first-occurring portion and a second-occurring portion immediately adjacent thereto;
  a symbol de-interleaver configured to:
    convert the binary stream into a plurality of interleaved symbols,
    de-interleave the interleaved symbols to generate a plurality of outer codewords each including a first-occurring symbol and a second-occurring-symbol immediately adjacent thereto, instances of the first-occurring symbol generated from the first-occurring portion and instances of the second-occurring symbol generated from the second-occurring portion; and
  an outer decoder configured to decode the outer codewords using an outer code to generate a decoded stream.

12. The concatenated decoder of claim 11, wherein parameters of the outer code are independent of parameters of the polar inner code.

13. The concatenated decoder of claim 11, wherein the polar inner decoder is further configured to decode the encoded stream using a successive cancellation decoding technique to generate a list of symbol candidates, and the outer decoder is further configured to decode the outer codewords using a generalized minimum distance decoding technique to select one of the symbol candidates from the list of symbol candidates.

14. The concatenated decoder of claim 13, wherein the polar inner decoder is further configured to determine an estimated probability for each of the symbol candidates by computing a product of estimated symbol probabilities, and wherein the outer decoder is further configured to select one of the symbol candidates based on the estimated probability for each of the symbol candidates.

15. The concatenated decoder of claim 14, wherein the polar inner decoder is further configured to determine the estimated probability for each of the symbol candidates for each of a plurality of possible paths.

16. The concatenated decoder of claim 11:
  wherein the encoded stream comprises a plurality of polar codewords,
  wherein the outer code comprises a block code with an alphabet size of $2^r$,
  wherein the polar inner decoder is further configured to decode the encoded stream using a successive cancellation decoding technique by, for each outer codeword, decoding a set of r bits of each polar codeword to find estimations for the symbols of the outer codeword and passing the estimations for the symbols to the outer decoder,
  wherein the outer decoder is further configured to generate a feedback output by correcting errors in the estimations for the symbols, and
  wherein the polar inner decoder is further configured, for each outer codeword, to update a decoded instance of the set of r bits of each polar codeword using the feedback output and to use an updated result of the decoded instance of the set of r bits to continue the successive cancellation decoding technique.

17. A method of decoding, comprising:
  decoding an encoded stream using a polar inner code to generate a binary stream including a first-occurring portion and a second-occurring portion immediately adjacent thereto;
  converting the binary stream into a plurality of interleaved symbols;
  de-interleaving the interleaved symbols to generate a plurality of outer codewords each including a first-occurring symbol and a second-occurring symbol immediately adjacent thereto, instances of the first-occurring symbol generated from the first-occurring portion and instances of the second-occurring symbol generated from the second-occurring portion; and
  decoding the outer codewords using an outer code to generate a decoded stream.

18. The method of claim 17, wherein parameters of the outer code are independent of parameters of the polar inner code.

19. The method of claim 17, wherein decoding the encoded stream comprises decoding the encoded stream using a successive cancellation decoding technique to generate a list of symbol candidates, and wherein decoding the outer codewords comprises using a generalized minimum distance decoding technique to select one of the symbol candidates from the list of symbol candidates.

20. The method of claim 19, wherein decoding the encoded stream using the successive cancellation decoding technique comprises determining an estimated probability for each of the symbol candidates by computing a product of estimated symbol probabilities, and wherein decoding the outer codewords further comprises selecting one of the symbol candidates based on the estimated probability for each of the symbol candidates.

21. The method of claim 20, wherein determining the estimated probability for each of the symbol candidates comprises determining the estimated probability for each of the symbol candidates for each of a plurality of possible paths.

22. The method of claim 17,
  wherein the encoded stream comprises a plurality of polar codewords,
  wherein the outer code comprises a block code with an alphabet size of $2^r$, and
  wherein decoding the encoded stream comprises decoding the encoded stream using a successive cancellation decoding technique by, for each outer codeword, (i) decoding a set of r bits of each polar codeword to find estimations for the symbols of the outer codeword, (ii) generating a feedback output by correcting errors in the estimations for the symbols, (iii) updating a decoded instance of the set of r bits of each polar codeword using the feedback output, and (iv) using an updated result of the decoded instance of the set of r bits to continue the successive cancellation decoding technique.

* * * * *